(12) United States Patent
Muller et al.

(10) Patent No.: US 8,881,537 B2
(45) Date of Patent: Nov. 11, 2014

(54) MAGNETOCALORIC THERMAL GENERATOR

(75) Inventors: Christian Muller, Strasbourg (FR); Jean-Claude Heitzler, Horbourg-Wihr (FR)

(73) Assignee: Cooltech Applications Societe par actions simplifiee, Holtzheim (FR)

( * ) Notice: Subject to any disclaimer, the term of this patent is extended or adjusted under 35 U.S.C. 154(b) by 797 days.

(21) Appl. No.: 13/123,593

(22) PCT Filed: Oct. 20, 2009

(86) PCT No.: PCT/FR2009/001223
§ 371 (c)(1),
(2), (4) Date: Apr. 11, 2011

(87) PCT Pub. No.: WO2010/046559
PCT Pub. Date: Apr. 29, 2010

(65) Prior Publication Data
US 2011/0192834 A1   Aug. 11, 2011

(30) Foreign Application Priority Data

Oct. 24, 2008   (FR) ..................... 08 05901

(51) Int. Cl.
*F25B 21/00* (2006.01)
*H01L 37/04* (2006.01)

(52) U.S. Cl.
CPC ............... *F25B 21/00* (2013.01); *Y02B 30/66* (2013.01); *H01L 37/04* (2013.01); *F25B 2321/002* (2013.01)
USPC .......................................................... 62/3.1

(58) Field of Classification Search
CPC .......... H05B 6/109; H05B 6/00; H01L 37/04; F25B 2321/00; F25B 2321/01; F25B 2321/002; F25B 2321/0022; F25B 2321/0023; Y02B 30/66
USPC ...................................................... 62/3.1, 3.3
See application file for complete search history.

(56) References Cited

U.S. PATENT DOCUMENTS 2,589,775 A * 3/1952 Chilowsky ..................... 62/3.1
3,413,814 A * 12/1968 Van Geuns ..................... 62/3.1
(Continued)

FOREIGN PATENT DOCUMENTS

DE   3410997 A1 *  9/1985  ............... H02K 9/00
DE   3815500 A1 * 11/1989  ............... F25B 21/00
(Continued)

*Primary Examiner* — Frantz Jules
*Assistant Examiner* — Emmanuel Duke
(74) *Attorney, Agent, or Firm* — Davis & Bujold, PLLC; Michael J. Bujold

(57) ABSTRACT

A heat generator (1) comprises at least one thermal module (1') which contains at least two adjacent magnetocaloric elements (2), and a common distribution chamber (3), associated with a heat transfer fluid circulation device (4), fluidly connects the adjacent magnetocaloric elements (2) with one another. Two end chambers (5, 6) are associated with a circulation means (7) and fluidly connected each with the two magnetocaloric elements (2) located at the hot end (9) and a cold (11) end of the thermal module (1). A magnetic arrangement of the heat generator (1) subjects each of the magnetocaloric element (2) to a variable magnetic field. The circulation mechanism (4), associated with the common distribution chamber (3), moves the heat transfer fluid simultaneously through the two adjacent magnetocaloric elements (2) in different circulation directions.

16 Claims, 4 Drawing Sheets

(56) References Cited

U.S. PATENT DOCUMENTS

| | | | |
|---|---|---|---|
| 4,272,226 A * | 6/1981 | Osborne | 417/418 |
| 4,507,928 A * | 4/1985 | Johnson | 62/3.1 |
| 4,599,866 A * | 7/1986 | Nakagome et al. | 62/3.1 |
| 6,332,323 B1 * | 12/2001 | Reid et al. | 62/6 |
| 6,415,611 B1 * | 7/2002 | Acharya et al. | 62/3.1 |
| 6,502,404 B1 * | 1/2003 | Arman et al. | 62/3.1 |
| 6,595,004 B1 * | 7/2003 | Ghoshal | 62/3.1 |
| 7,481,064 B2 | 1/2009 | Kitanovski et al. | |
| 2007/0125095 A1 * | 6/2007 | Iwasaki et al. | 62/3.1 |
| 2007/0186560 A1 * | 8/2007 | Schauwecker et al. | 62/3.1 |
| 2007/0220901 A1 * | 9/2007 | Kobayashi et al. | 62/3.1 |
| 2008/0236172 A1 | 10/2008 | Muller et al. | |
| 2009/0320499 A1 | 12/2009 | Muller et al. | |
| 2010/0095686 A1 | 4/2010 | Cramet et al. | |
| 2010/0236258 A1 | 9/2010 | Heitzler et al. | |

FOREIGN PATENT DOCUMENTS

| | | | |
|---|---|---|---|
| FR | 07/07612 | 10/2007 | |
| FR | 07/07612 A1 | 10/2007 | |
| FR | 2 904 098 A1 | 1/2008 | |
| FR | 2 914 051 A1 | 9/2008 | |
| WO | 2004/059221 A1 | 7/2004 | |
| WO | 2005/093343 A1 | 10/2005 | |
| WO | WO 2005095872 A1 * | 10/2005 | F25B 21/00 |
| WO | WO 2006074790 A1 * | 7/2006 | |
| WO | 2007/026062 A1 | 3/2007 | |
| WO | WO 2007101433 A1 * | 9/2007 | |

* cited by examiner

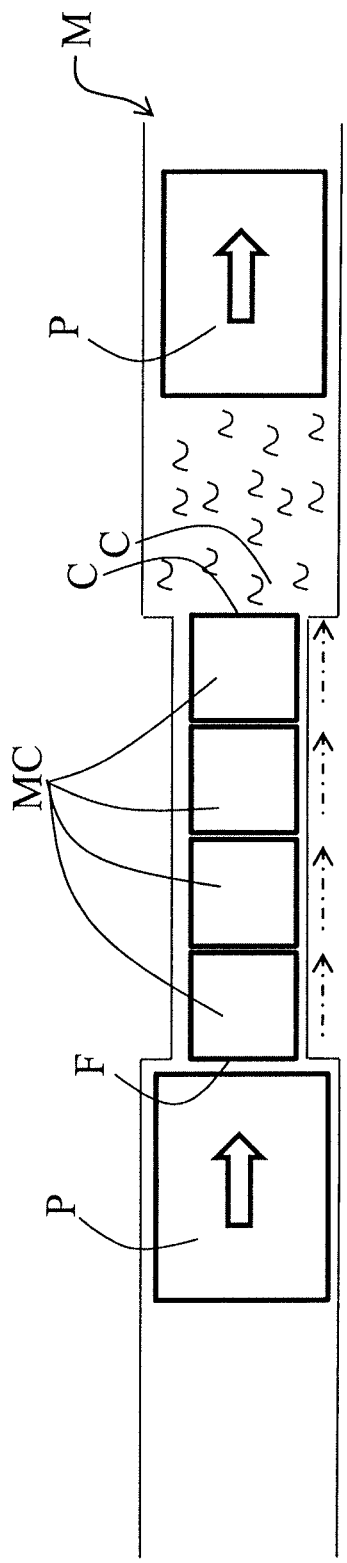
(PRIOR ART) FIG. 1A
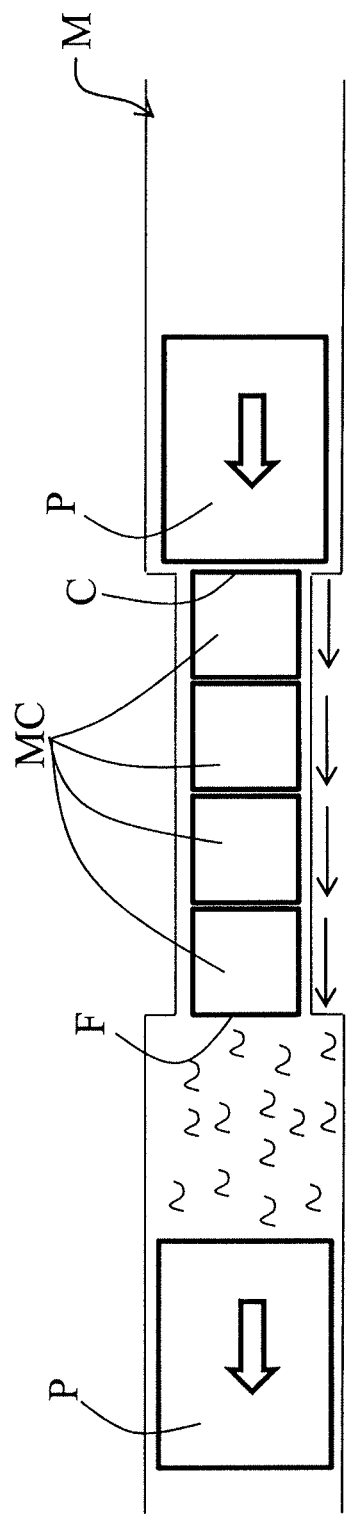
(PRIOR ART) FIG. 1B

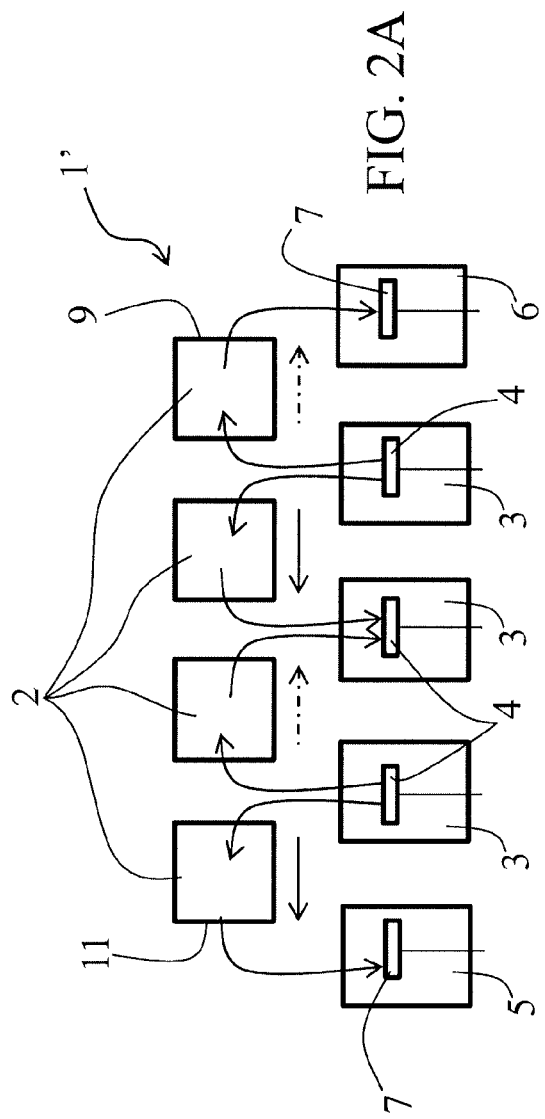
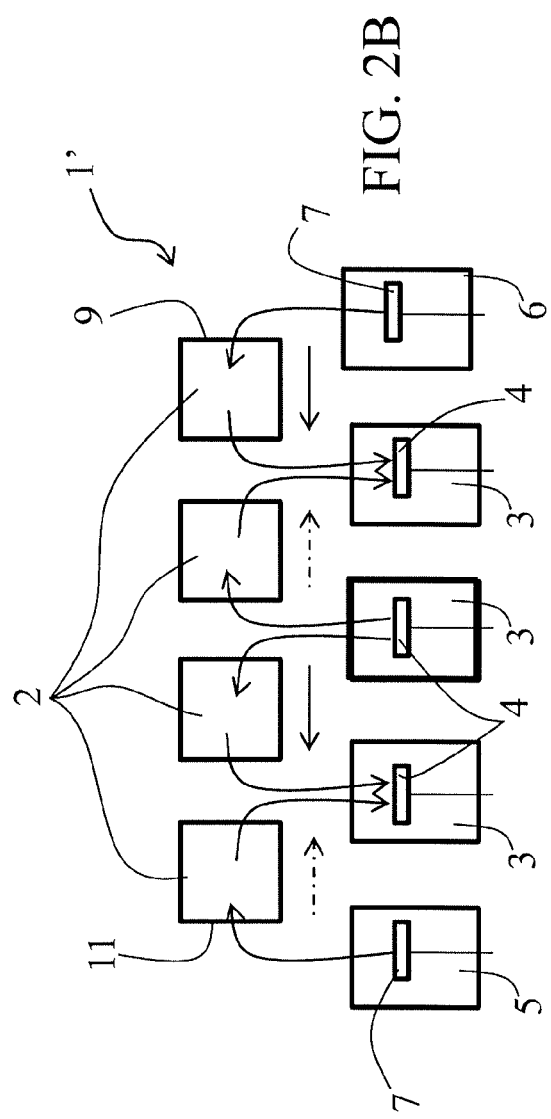

US 8,881,537 B2

MAGNETOCALORIC THERMAL GENERATOR

This application is a National Stage completion of PCT/FR2009/001223 filed Oct. 20, 2009, which claims priority from French patent application Ser. No. 08/05901 filed Oct. 24, 2008.

FIELD OF THE INVENTION

The present invention relates to a heat generator comprising at least one thermal module containing at least two adjacent magnetocaloric elements arranged for being crossed by a heat transfer fluid, a common distribution chamber associated with a heat transfer fluid circulation means which fluidly connects adjacent magnetocaloric elements with each other and two end chambers also associated with a circulation means and respectively fluidly connected with the magnetocaloric element located at the ends of the thermal module, called the hot end and the cold end, and a magnetic arrangement which subjects each magnetocaloric element to a variable magnetic field, creating alternately in each magnetocaloric element a heating cycle and a cooling cycle, circulation of the heat transfer fluid through the magnetocaloric elements being ensured by the circulation means, in synchronization with the variation of the magnetic field.

BACKGROUND OF THE INVENTION

Magnetic refrigeration technology has been known for more than twenty years and the advantages it provides with regard to ecology and sustainable development are widely acknowledged. Its limits in terms of its useful calorific output and its efficiency are also well known. Consequently, all the research undertaken in this field relates to improving the performance of such a generator, by adjusting the various parameters, such as the magnetization power, the performance of the magnetocaloric element, the heat exchange surface between the heat transfer fluid and the magnetocaloric elements, the performance of the heat exchangers, etc.

The choice of the magnetocaloric materials is determining and has a direct effect on the performance of a magnetocaloric heat generator. To increase the performance, a solution consists in associating several magnetocaloric materials having different Curie temperatures in order to increase the temperature gradient between the ends of this assembly.

So, heat generators are known, comprising at least one thermal module M such as the one represented in FIGS. 1A and 1B and which comprises magnetocaloric materials MC arranged and aligned side by side, and circulation means for the heat transfer fluid, such as pistons P, intended for moving the heat transfer fluid with a reciprocating movement through the whole of the magnetocaloric materials MC, to both ends of these, between the cold side F and the hot side C of the assembly of magnetocaloric materials MC, and in synchronization with the variation of a magnetic field. As shown in FIGS. 1A and 1B, these pistons P are arranged at both ends of the assembly of magnetocaloric materials MC and move alternately in one direction and in the other, FIGS. 1A and 1B show the pistons in their both extreme positions.

It appears in FIGS. 1A and 1B that the fluid moves either in one direction, towards the hot end C (the direction of movement of the heat transfer fluid is represented by the dotted arrows, see FIG. 1A) when the magnetocaloric materials undergo a heating cycle, or in the other direction, towards the cold end F (the direction of movement of the heat transfer fluid is represented by the solid arrows, see FIG. 1B) when the magnetocaloric materials undergo a cooling cycle.

This thermal module M has a disadvantage linked with the fact that, to reach a temperature gradient, a heat transfer fluid must be circulated through the whole of the materials. The use of several magnetocaloric elements MC leads to an increase of the length of the material across which the heat transfer fluid flows. Thus, in order not to reduce the number of cycles (a cycle being defined by a heating and a cooling of the magnetocaloric element), it is necessary to increase the speed of the heat transfer fluid. But the increase of the speed leads to an increase of the pressure, which increases the head losses and reduces the efficiency of the heat exchange between the heat transfer fluid and the magnetocaloric elements, which in turn leads to a decrease of the calorific output of the magnetocaloric generator.

It is also known that, to increase the calorific output of a magnetocaloric generator, it is possible to increase the number of cycles. But this leads to an increase of the speed and also to the above-mentioned disadvantages.

A generator comprising a thermal module M as shown in FIGS. 1A and 1B requires a significant amount of operating time to reach an utilizable temperature gradient between both ends, due to the multiplicity of the materials used.

SUMMARY OF THE INVENTION

The present invention aims to overcome these disadvantages by proposing a magnetocaloric heat generator that is easy to implement and whose calorific output is improved with respect to the known generators, with the same quantity or length of magnetocaloric material.

For this purpose, the invention concerns a heat generator in which the circulation means associated with the common distribution chamber moves the heat transfer fluid simultaneously through the two adjacent magnetocaloric elements, in different directions of circulation.

The magnetic arrangement can preferably continually subject the magnetocaloric elements to two different cycles and the circulation means associated with the common chamber can move the heat transfer fluid in a simultaneous way, through the magnetocaloric element subjected to a heating cycle, towards the hot end and, through the magnetocaloric element subjected to a cooling cycle, towards the cold end of the thermal module.

The thermal module can furthermore comprise at least three magnetocaloric elements, the circulation means associated with the common chamber can move the heat transfer fluid alternately towards the two adjacent magnetocaloric elements, and then in the opposite direction, at the outlet of the adjacent heat modules, and conversely, two circulation means of two consecutive common chambers can constantly move the heat transfer fluid in two opposite directions, and the circulation means associated to the end chambers can move the heat transfer fluid in the direction opposite to that of the common chamber adjacent to them.

The heat generator can comprise preferably an even number of magnetocaloric elements. This way, at any time, each thermal module comprises as much magnetocaloric elements undergoing a heating cycle as magnetocaloric elements undergoing a cooling cycle.

To increase the operating temperature range of the generator (for example between −25° C. and +65° C.), the magnetocaloric elements may each comprise a different Curie temperature and be arranged adjacently according to their increasing Curie temperature towards the hot end of the thermal module.

In this configuration, the magnetocaloric elements may also comprise each several magnetocaloric materials arranged according to their increasing Curie temperature towards the hot end of the thermal module.

In a characteristic way, the volume of heat transfer fluid moved by a circulation means associated with an end chamber can correspond to half of the volume of heat transfer fluid moved by the circulation means associated with a common chamber.

Preferably, the circulation means can be pistons integrated in the common chambers and the end chambers, and of which only one end acts upon the heat transfer fluid. The end must be understood as the working side or head of the piston that is in contact with the heat transfer fluid. Of course, any other form of circulation means can be provided.

In a first embodiment, the thermal module can have a linear structure in which the magnetocaloric elements are aligned and the pistons can be actuated by a corresponding driving cam mounted on a shaft rotating on itself.

In this configuration, the heat generator can be made of four thermal modules, the driving cam can comprise lobes offset from each other by an angle of 90° and the thermal modules can be arranged radially around the shaft so that each lobe actuates a piston of each of the four thermal modules.

In a second embodiment, the thermal module can have a linear structure in which the magnetocaloric elements are aligned and the operation of the pistons can be performed by a driving carriage that moves according to a reciprocating movement along the thermal module and comprising a guide groove in which corresponding linking elements of each piston are guided.

The guide groove may have a serrated shape and the pistons may be arranged approximately in front of the driving carriage.

Furthermore, the heat generator can comprise several thermal modules arranged above each other according to a stepped structure.

The invention also provides that the heat generator can comprise at least two thermal modules and that, on the one hand, the hot end chambers can communicate fluidly with each other and that, on the other side, the cold end chambers can communicate fluidly with each other.

Furthermore, the heat generator according to the invention can comprise at least two thermal modules comprising the same number of magnetocaloric elements and the common chambers of the thermal modules can communicate fluidly with each other two by two.

BRIEF DESCRIPTION OF THE DRAWINGS

The present invention and its advantages will be better revealed in the following description of an embodiment given as a non limiting example, in reference to the drawings in appendix, in which:

FIGS. 1A and 1B are schematic views of a thermal module according to the previous art, FIGS. 2A and 2B are schematic views of a thermal module made of four magnetocaloric elements respectively in two different states and illustrating the displacement of the heat transfer fluid through the latter.

DETAILED DESCRIPTION OF THE PREFERRED EMBODIMENTS

In the implementation examples shown, the identical parts or sections have the same numerical references.

Figure 4:
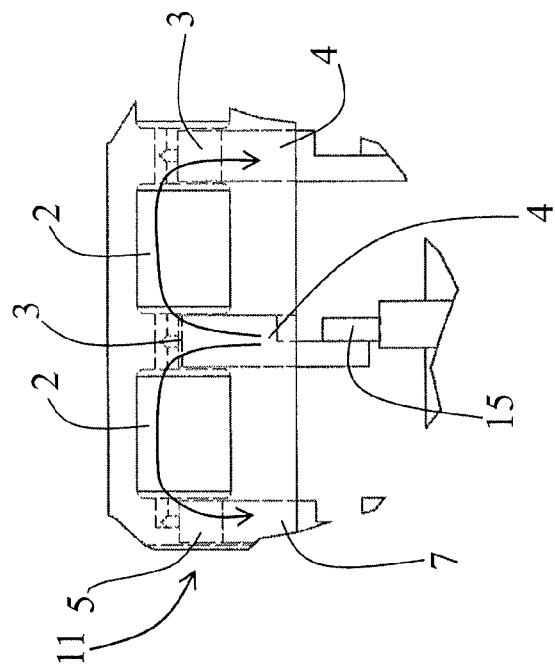
FIG. 4 is a transparent elevation view of detail A of FIG. 3.
Figure 3:
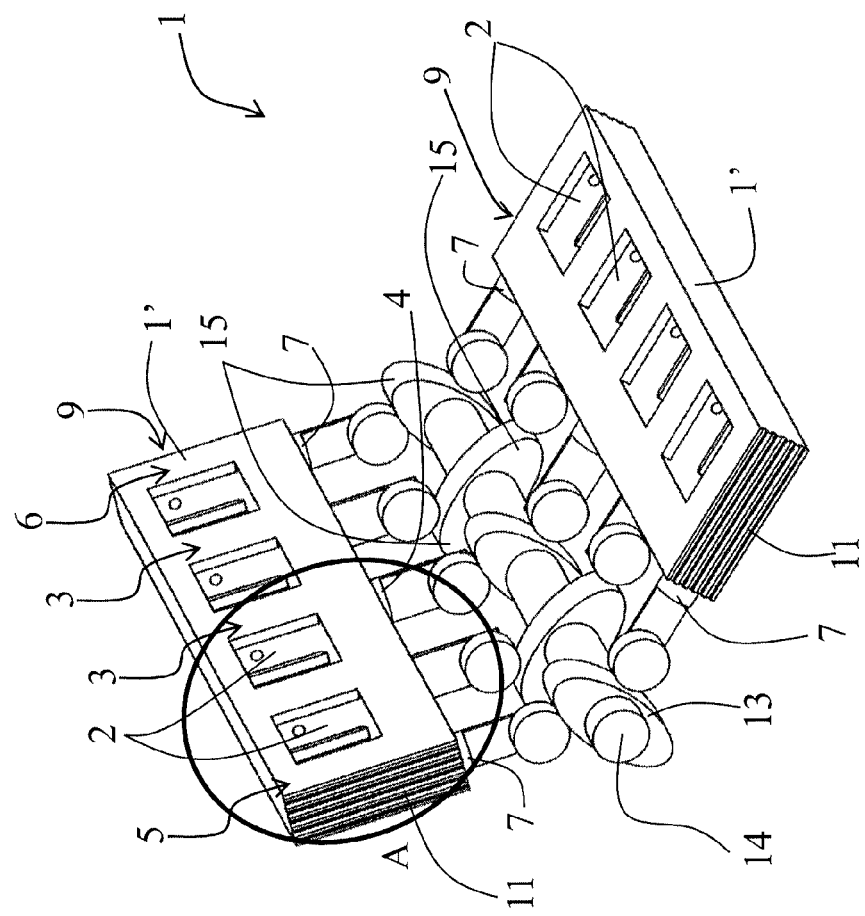
FIG. 3 is a perspective view of a first embodiment of the heat generator according to the invention.

The heat generator 1 represented in FIGS. 3 and 4 is carried out according to a first embodiment of the invention. It includes two thermal modules 1' each comprising aligned magnetocaloric elements 2. A common chamber 3 comprising a piston 4, that makes up a forced circulation means of the heat transfer fluid, is placed every time between two adjacent magnetocaloric elements 2. Furthermore, the heat module 1' also comprises two end chambers 5 and 6 located at the hot end 9 and cold end 11 of the thermal module 1', each also comprising a piston 7 making up a circulation means.

Each magnetocaloric element 2 can be crossed by a heat transfer fluid that is circulated by the pistons 4, 7 and is subjected to a magnetic field variation by means of a (not represented) magnetic arrangement which generates alternating heating and cooling cycles. The displacement of the pistons 4, 7 is synchronized with the variation of the magnetic field, so that the heat transfer fluid moves towards the hot end 9 through each magnetocaloric element 2 subjected to a heating cycle (dotted arrows) and towards the cold end 11 through each magnetocaloric element 2 subjected to a cooling cycle (solid arrows). Such displacement is possible thanks to the arrangement of the pistons 4, 7 in the common chambers 3 and the end chambers 5, 6, and to the specific distribution of heat transfer fluid that ensues from this. The pistons 4 in the common chambers 3 each distribute the heat transfer fluid in two adjacent magnetocaloric elements 2. In FIGS. 3 and 4, the pistons 4, 7 are perpendicular to the alignment of the magnetocaloric elements 2 such that only one end of the pistons 4, 7 ensures the movement of the heat transfer fluid. Of course, another configuration can be envisaged, provided that only one end of a piston 4 in a common chamber 3 is in contact with the heat transfer fluid and ensures its movement in two magnetocaloric elements 2.

The displacement of the heat transfer fluid described above facilitates creating a temperature gradient between the hot end 9 and the cold end 11 of the thermal module and maintaining this gradient during the extraction or the exchange of thermal energy with an external application or circuit. The heat generator according to the invention is intended for exchanging thermal energy with one or several external user circuits (heating, air-conditioning, tempering, etc.), being connected to it (them) by means of at least one end chamber 5, 6, possibly via a heat exchanger.

Moreover, and this is applicable in both illustrated embodiments, circulating the heat transfer fluid from the common chambers 3 through two adjacent magnetocaloric elements 2, and simultaneously in a different flow direction in each of these two magnetocaloric elements 2, shows many advantages with respect to the known generators, in which the fluid circulates simultaneously through all magnetocaloric elements MC in a first direction, from the first magnetocaloric element to the last magnetocaloric element, then through the same magnetocaloric elements MC, but in the direction opposite to the first (see FIGS. 1A and 1B).

A first advantage appears in FIGS. 2A and 2B and stems from the fact that the head losses are distributed and reduced, since the heat transfer fluid circulated by a piston 7 only passes through one magnetocaloric element 2 at a time and the heat transfer fluid circulated by a piston 4 only crosses two at a time, and not all magnetocaloric elements 2 making up a thermal module 1', 10'. In relation to this, with reference to FIGS. 2A and 2B, the arrows drawn underneath the magnetocaloric elements 2 illustrate the direction of the movement of the heat transfer fluid, the dotted arrows corresponding to a movement towards the hot end 9 and the solid arrows corresponding to a movement towards the cold end 11.

A second advantage appears when one compares the known system represented in FIGS. 1A and 1B with that according to the invention, having the same length of magnetocaloric materials in both. One notes that, for the same speed of the heat transfer fluid crossing the magnetocaloric elements MC, 2, the frequency of the cycles is multiplied by four in the heat generator 1, 10 of the invention. As a result of this the calorific output of such a heat generator 1, 10 is also increased in the same proportion.

As an illustrative example the speed of the heat transfer fluid speed is 100 mm/s and the length of each magnetocaloric element is 100 millimeter:

to pass through all magnetocaloric elements MC of the known system as represented in FIGS. 1A and 1B, the time required is (4×100)÷100=4 seconds, which corresponds to a frequency of 0.25 hertz, while, to pass through all magnetocaloric elements 2 of the heat generator 1, 10 according to the invention, the time required is (1×100)÷100=1 second, which corresponds to a frequency of 1 hertz.

Also, and still comparing the heat generator 1, 10 according to the invention with the known system, one notes that for cycles with identical frequency (demagnetization and magnetization), the speed of displacement of the heat transfer fluid is divided by four in the heat generator 1, 10 according to the invention. In the latter, this results in reduced head losses, which is equivalent to an increase of the exchange time, and thus of the calorific output of this exchange.

As an illustrative example, for a frequency of 0.5 hertz which corresponds to a heating (or magnetization) cycle of one second and to a cooling (or demagnetization) cycle of one second and a length of 100 millimeters per magnetocaloric element:

to pass through all magnetocaloric elements MC of the known system represented in FIGS. 1A and 1B in one second, the speed of the heat transfer fluid must be (4×0.100)÷1=0.4 m/s, while, to pass through all magnetocaloric elements 2 of the heat generator 1, 10 according to the invention, the speed of the heat transfer fluid, circulated at the level of each common chamber 3, is (1×0.100)÷1=0.1 m/s.

The magnetocaloric elements 2 are not represented in FIG. 3 for simplification purposes. These magnetocaloric elements comprise open fluid passages that can be made of the pores of a porous material, the mini or micro-channels machined in a full block or obtained by assembling for example superposed grooved plates.

Preferably, to increase the temperature gradient between the hot end 9 and the cold end 11, the magnetocaloric elements 2 are arranged with respect to each other according to their increasing Curie temperature, the magnetocaloric elements 2 having the highest Curie temperature being located at the hot end 9 of the concerned thermal module 1'.

Furthermore, each magnetocaloric element 2 can be made of an assembly of several different magnetocaloric materials, also arranged according to their increasing Curie temperature.

As it appears in FIG. 3, the pistons 4 that are integrated in the common chambers 3 are actuated by driving cams 13 mounted on a rotating shaft 14, the cams comprising lobes 15 that are offset from each other by an angle of 90°. According to the rotational angle of the shaft 14, the lobes 15 either push the rod of the corresponding pistons 4, 7 or not, which determines the direction of the displacement of each piston 4, 7.

FIG. 4 illustrates the extreme positions of the pistons 4, 7. The pistons 7 and 4 are arranged respectively in the end chamber 5 at the cold end 11 of the element 1' and in a common chamber 3 (on the right in FIG. 4) in their retracted position, allowing the heat transfer fluid to fill the chamber in which they are integrated. The central piston 4 is in a position in which it pushes the fluid contained in the corresponding common chamber 3 in the direction of the two magnetocaloric elements 2 adjacent to the common chamber 3, and this in two opposite directions. The heat transfer fluid moves according to the curved arrows drawn in this FIG. 4.

This figure shows clearly that the volume of the heat transfer fluid being displaced by the piston 7 and associated with the end chamber 5 corresponds to half the volume of the heat transfer fluid displaced by the piston 4 in the adjacent common chamber 3.

In addition, particularly when an even number of magnetocaloric elements 2 is integrated in a thermal module, the common chambers 3 form intermediate baths allowing for the averaging of the temperature of the heat transfer fluid and thus reducing the time necessary to reach the temperature gradient between the hot end 9 and the cold end 11 of each thermal module 1, 10'.

The heat generator 1 of FIGS. 3 and 4 comprises two thermal modules 1'. This number is however not limiting, it can be higher or lower, according to the available space and the required calorific output. In fact, this heat generator 2 could also comprise four thermal modules 1' arranged in star around the shaft 14 and whose pistons 4, 7 are actuated by the cams 13.

Figure 5:
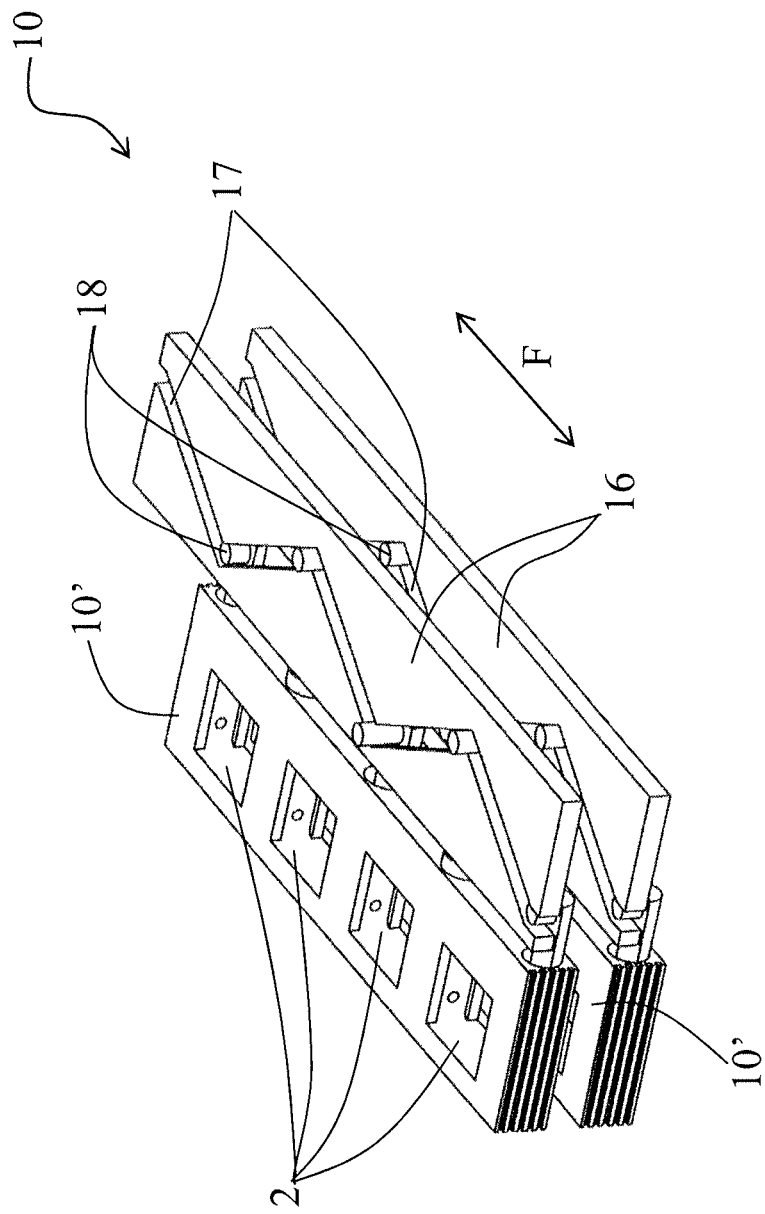
FIG. 5 is a perspective view of a second embodiment of the heat generator according to the invention.

The heat generator 10 represented in FIG. 5 distinguishes itself from the previous one by the actuation of the pistons 4, 7. It is performed by means of a driving carriage 16 that moves with reciprocating movement according to the arrow F along the concerned thermal module 10'. This driving carriage 16 comprises a guide groove 17 having a serrated shape, in which linking elements 18 connected to the pistons 4, 7 are moving.

Even though the heat generator 10 represented in FIG. 5 comprises two superposed thermal modules 10', a heat generator 10 according to the invention is not limited to this number of thermal modules 10', nor to their superposed arrangement.

Moreover, even though this is not represented in the attached figures, it may be provided, in a heat generator according to the invention which comprises several thermal modules that, on the one hand, the hot end chambers 5 are in fluidic communication with each other and that, on the other hand, the cold end chambers 6 are also in fluidic communication with each other. It may in particular be provided that the hot end chambers 5 are combined and form only one chamber. The same applies to the cold end chambers 6.

Such a configuration allows thermally linking the various thermal modules with each other and can in particular facilitate the heat exchange with an external application. It also allows adding or combining the calorific outputs of the various thermal modules.

In an additional variant, it is possible to provide that the common chambers 3 of the various thermal modules of a heat generator according to the invention communicate fluidly with each other two by two. To that purpose, the thermal modules must comprise the same number of magnetocaloric elements 2.

The advantage of such a configuration lies in the fact that the temperatures of the common chambers 3 are smoothed or averaged to obtain an operating regularity of the heat generator.

POSSIBILITIES FOR INDUSTRIAL APPLICATION

This description clearly shows that the invention allows reaching the goals defined, that is to say to offer a heat generator 1, 10 with a simple design and improved efficiency.

Such a heat generator 1, 10 can be utilized in industrial as well as domestic applications, in the area of heating, air conditioning, tempering, cooling or others, at competitive costs and with reduced space requirements.

Furthermore, all parts making up this heat generator 1, 10 can be manufactured according to reproducible industrial processes.

The present invention is not restricted to the examples of embodiment described, but extends to any modification or variant which is obvious to a person skilled in the art while remaining within the scope of the protection defined in the attached claims.

The invention claimed is:

1. A heat generator (1, 10) comprising:
at least one thermal module (1', 10') containing at least two adjacent magnetocaloric elements (2) arranged for being passed through by a heat transfer fluid,
a common distribution chamber (3) being associated with a heat transfer fluid circulation means (4) fluidly connecting the adjacent magnetocaloric elements (2) and two end chambers (5, 6) also associated with a circulation means (7) with each other and fluidly connected respectively with the magnetocaloric element (2) located at the ends of the thermal module (1', 10') which are a hot end (9) and a cold end (11),
a magnetic arrangement of the heat generator (1, 10) subjecting each magnetocaloric element (2) to a variable magnetic field to create alternately, in each magnetocaloric element (2), a heating cycle and a cooling cycle, and
circulation of the heat transfer fluid through the magnetocaloric elements (2) being ensured by the circulation means (4, 7), in synchronization with the variation of the magnetic field,
wherein the circulation means (4), associated with the common chamber (3), displaces the heat transfer fluid simultaneously through the two adjacent magnetocaloric elements (2) in different circulation directions.

2. The heat generator according to claim 1, wherein the magnetic arrangement continuously subjects the adjacent magnetocaloric elements (2) to two different cycles and the circulation means (4), associated with the common chamber (3), moves the heat transfer fluid in a simultaneous way, through the magnetocaloric element (2), subjected to a heating cycle, towards the hot end (9), and through the magnetocaloric element (2), subjected to a cooling cycle, towards the cold end (11) of the thermal module (1', 10').

3. The heat generator according to claim 1, wherein the thermal module (1', 10') comprises at least three magnetocaloric elements (2), the circulation means (4) associated with the common chamber (3) moves the heat transfer fluid alternately towards the two adjacent magnetocaloric elements (2), and then in an opposite direction, at the outlet of the adjacent heat modules (2), and conversely, the two circulation means (4) of two consecutive common chambers (3) continuously move the heat transfer fluid in two opposite directions, and the circulation means (7) associated with the two end chambers (5, 6) move the heat transfer fluid in the direction opposite that of the common chamber (3) adjacent to them.

4. The heat generator according to claim 3, wherein the heat generator comprises an even number of magnetocaloric elements (2).

5. The heat generator according to claim 3, wherein the magnetocaloric elements (2) each comprise several magnetocaloric materials arranged according to an increasing Curie temperature towards the hot end (9) of the thermal module.

6. The heat generator according to claim 1, wherein all the magnetocaloric elements (2) have a different Curie temperature and are adjacently arranged according to their increasing Curie temperature towards the hot end (9) of the thermal module.

7. The heat generator according to claim 1, wherein a volume of heat transfer fluid, moved by the circulation means (7) associated with the end chamber (5, 6), corresponds to half of the volume of the heat transfer fluid moved by the circulation means (4) associated with a common chamber (3).

8. The heat generator according to claim 1, wherein the circulation means (4, 7) are pistons integrated in the common chambers (3) and the end chambers (5, 6) and of which only one end (12) acts upon the heat transfer fluid.

9. The heat generator according to claim 8, wherein the thermal module (1') has a linear structure in which the magnetocaloric elements (2) are aligned and the pistons (4, 7) are actuated by a corresponding driving cam (13) mounted on a shaft (14) rotating on itself.

10. The heat generator according to claim 9, wherein the heat generator comprises four thermal modules (1'), the driving cam (13) comprises lobes (15) that are offset from one another by an angle of 90° and the thermal modules (1') are arranged radially around the shaft (14) such that each of the lobes (15) actuates a piston (4, 7) of each of the four thermal modules (1').

11. The heat generator according to claim 1, wherein the thermal module (10') has a linear structure in which the magnetocaloric elements (2) are aligned and pistons (4, 7) are actuated by a driving carriage (16) that moves, according to a reciprocating movement, along the thermal module (10') and comprising a guide groove (17) in which corresponding linking elements (18) of each of the pistons (4, 7) are guided.

12. The heat generator according to claim 11, wherein the guide groove (15) has a serrated shape and the pistons (4, 7) are arranged approximately in front of the driving carriage (16).

13. The heat generator according to claim 11, wherein the heat generator comprises several thermal modules (10') arranged above each other according to a stepped structure.

14. The heat generator according to claim 1, wherein the heat generator comprises at least two thermal modules (1', 10') and, on one side, the hot end chambers (5) fluidly communicate with one another and, on another side, the cold end chambers (6) fluidly communicate with one another.

15. The heat generator according to claim 1, wherein the heat generator comprises at least two thermal modules (1', 10') which comprise a same number of magnetocaloric elements (2) and the common chambers (3) of the thermal modules (1', 10') fluidly communicate two by two with one another.

16. A heat generator (1, 10) comprising:
at least one thermal module (1', 10') containing at least two adjacent magnetocaloric elements (2) through which a heat transfer fluid flows, a common distribution chamber (3) comprising a heat transfer fluid circulation means (4) fluidly connecting the adjacent magnetocaloric elements (2) with one another, a hot end chamber (5) and a cold end chamber (6) being located at a respective one of a hot end (9) and a cold end (11) of the thermal module (1', 10'), the hot and the cold end chambers (5, 6) communicating with a further circulation means (7), a magnetic arrangement subjecting each of the magnetocaloric elements (2) to a variable magnetic field to alternately create a heating cycle and a cooling cycle, and the fluid and the further circulation means (4, 7) conducting the heat transfer fluid through the magnetocaloric elements (2) in synchronization with variation of a magnetic field directed at the magnetocaloric elements (2), wherein the fluid circulation means (4) displaces the heat transfer fluid simultaneously through the two adjacent magnetocaloric elements (2) in different circulation directions.

* * * * *